United States Patent
Agostinelli

(10) Patent No.: US 7,337,346 B2
(45) Date of Patent: Feb. 26, 2008

(54) METHOD AND APPARATUS FOR FINE TUNING A MEMORY INTERFACE

(75) Inventor: Gregory Agostinelli, Richmond Hill (CA)

(73) Assignee: ATI Technologies Inc., Markham, Ontario (CA)

( * ) Notice: Subject to any disclaimer, the term of this patent is extended or adjusted under 35 U.S.C. 154(b) by 467 days.

(21) Appl. No.: 10/792,938

(22) Filed: Mar. 4, 2004

(65) Prior Publication Data

US 2005/0197082 A1 Sep. 8, 2005

(51) Int. Cl.
*G06F 1/04* (2006.01)
(52) U.S. Cl. .................... 713/500; 702/107
(58) Field of Classification Search ........... 713/500; 702/107
See application file for complete search history.

(56) References Cited

U.S. PATENT DOCUMENTS 6,137,734 A * 10/2000 Schoner et al. ........... 365/194
6,853,938 B2 * 2/2005 Jeddeloh .................... 702/107
7,036,053 B2 * 4/2006 Zumkehr et al. ........... 714/709
7,058,533 B2 * 6/2006 Jeddeloh .................... 702/107

* cited by examiner

Primary Examiner—Thomas Lee
Assistant Examiner—Albert Wang
(74) Attorney, Agent, or Firm—Vedder, Price, Kaufman & Kammholz, P.C.

(57) ABSTRACT

A method and apparatus for fine tuning a memory interface includes receiver operative to receive an input signal. The method and apparatus includes a clock counter operative to calculate a time value based upon the timed sequence determined by the reception of the input signal. The method and apparatus further includes a comparator coupled to receive an input strength indicator signal from the receiver and operative to generate a comparative strength signal based on the comparison of the input signal strength indicator signal and a reference strength signal. Furthermore, the method and apparatus includes a tuner coupled to the clock counter so the tuner receives the time value from the counter, and coupled to the comparator to receive the comparative strength signal from the comparator, whereupon the tuner then generates a tuning signal utilized for an iterative tuning process to fine tune a memory interface.

24 Claims, 5 Drawing Sheets

METHOD AND APPARATUS FOR FINE TUNING A MEMORY INTERFACE

FIELD OF THE INVENTION

The present invention relates generally to interfacing between a processing device and a memory, more specifically to automatic fine tuning of a memory interface between the processor and the memory.

BACKGROUND OF THE INVENTION

A typical computing system is composed of multiple processors and various memory components in electrical communication with each other allowing for communication of data therebetween. A typical processing system, which may include one or more of a plurality of processors, must be coordinated so the interfacing with the memory device is done on a timely basis. For example, timing signals must be properly coordinated so the processing device requests and receives data in proper synchronization with the memory device. Another example of an element that must be tuned is a skew rate.

Previously, fine tuning a memory device with a processing device, such as an application specific integrated circuit (ASIC) is performed by hand. Using an oscilloscope, signal strengths and signal timings are measured between the processing device and the memory. Based on these signal measurements, control values within the processing device, such as resistive or capacitive loads, hardware logic, firmware or any other implementation for executing operations, are thereby adjusted. Once the processing device is provided with new parameters, further measurements are then taken on new signals between the processing device and the memory. Once again, based on these measurements, re-calculations are made for elements within the processing device. The iterative process is repeated until the interface between the memory and the processing device is finely tuned. The current approach is extremely inefficient and time consuming. The manual calculations are labor intensive and utilize a significant amount of time for one or more individuals to perform all the calculations in the iterative process to effectuate the tuning. Furthermore, when a processing device is utilized with different memories for different applications, the processing device may need to be specifically tuned for each of the memory devices. Therefore, simply because a processing device is tuned for a first memory, if that processing device is then implemented using a second memory in a second system, the tuning process must be redone. As such, this further limits efficiency with regards to utilizing a particular processing device in different processing environments or systems.

Therefore, there exists a need for a method and apparatus to automatically fine tune a memory interface with respect to a particular memory.

DETAILED DESCRIPTION OF A PREFERRED EMBODIMENT

A method and apparatus for fine tuning a memory interface includes a receiver to receive an input signal, wherein the receiver may be implemented within hardware, software combination thereof to receive an input signal, wherein the input signal maybe any standard incoming signal. The method and apparatus further includes a clock counter that is operative to calculate a time value based on the timed sequence determined by reception of the input signal.

The method and apparatus further includes a comparator operatively coupled to receive an input signal strength indicator signal from the receiver, wherein the input signal strength indicator indicates the strength of the input signal. The comparator is operative to generate a comparative strength signal based on the comparison of the input signal strength indicator signal and a reference strength signal which may be any suitable reference strength, typically in terms of a preferred voltage. The method and apparatus includes a tuner operatively coupled to the clock counter such that the tuner operatively receives the time value from the counter. The tuner is operatively coupled to the comparative strength signal from the comparator. Using internal calculations within the tuner based on the received signals and predetermined tuning parameters, the tuner generates a tuning signal. Method and apparatus thereupon provides the tuning signal to a memory device or impedance load representing the memory device, such that a new input signal may be generated. The above-noted apparatus repeats the method for fine tuning the memory interface and utilizes an iterative process to automatically fine tune the memory interface through generating further turning signals and optimizing interface parameters.

Figure 1:
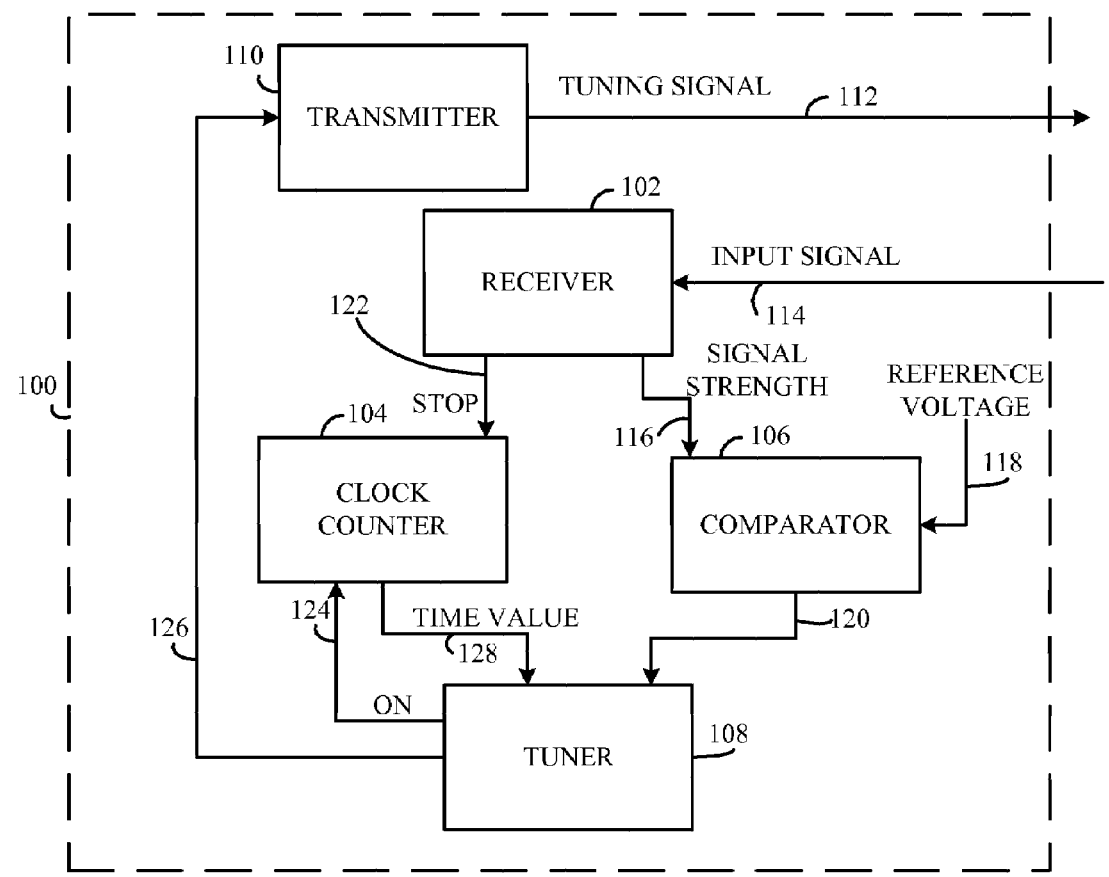
FIG. 1 illustrates one embodiment of an apparatus for fine tuning a memory interface.

More specifically, FIG. 1 illustrates a memory interface fine tuning device 100 which may be disposed within an ASIC. The memory interface fine tuning device 100 includes a receiver 102, a clock counter 104, a comparator 106, a tuner 108 and a transmitter 110. In one embodiment, the transmitter 110 transmits a tuning signal 112. This tuning signal 112 is transmitted to either a memory device, a impedance load emulating the memory device or a combination thereof (none illustrated in FIG. 1). The receiver 102 may also be disposed within the memory device such that tuning signal 112 may be transmitted directly to the receiver 102. In another embodiment, the transmitter 110 may be disposed within the memory device. Moreover, the memory device may also have a loop back implementation to send its received signal back to a processor. The memory may then enable the receiver 102, transmitter 110 and loopback modes via an extended memory register settings commands (EMRS).

The receiver 102 receives an input signal 114 back from the element receiving the tuning signal, wherein the input signal is the modified tuning signal 112 and provides the signal strength 116 to the comparator 106. The comparator compares the signal strength 116 with a reference voltage 118 to determine a comparative strength signal 120. The receiver 102 also generates an off signal 122 which is provided to the clock counter 104. In one embodiment the clock counter 104 receives an on signal 124 from the tuner 108 when the tuner 108 generates a pre-transmission tuning signal 126 provided to the transmitter 110. Upon receiving the on signal 124, the clock counter 104 begins a timing interval and upon receiving the stop signal 122, the counter determines the timing based on the time between the on signal 124 and the stop signal 122, wherein a time value 128 is the length of the timing interval.

In one embodiment, the tuner 108 receives the time value 128 and the comparative strength signal 120 from the comparator 106. The tuner 108 performs internal calculations to determine if the memory interface fine tuning device 100 is properly tuned to send a signal, such as the tuning signal 112 and to receive an expected input signal 114 based on characteristics of a memory device (not shown). The tuner 108 generates new signals for testing the memory interface based on an iterative process. If the memory interface fine tuning device 100 is not properly tuned for interfacing with a memory device, the tuner 108 generates a pre-transmission tuning signal 126, which is provided to the transmitter 110. The transmitter 110 formulates the pre-transmission tuning signal 126 so it is in proper format to be transmitted as output tuning signal 112.

Figure 2:
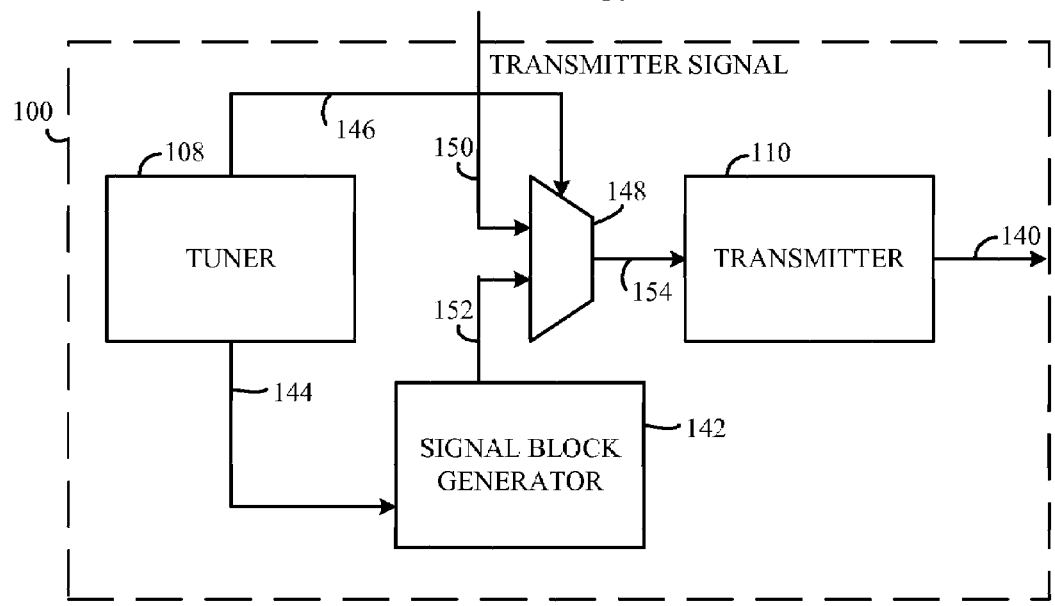
FIG. 2 illustrates another embodiment of a portion of an apparatus for fine tuning a memory interface.

FIG. 2 illustrates another embodiment of the memory interface fine tuning device 100 for generating an original transmission signal 140. The memory interface fine tuning device 100 includes the tuner 108, the transmitter 110 and a signal block generator 142. In one embodiment, the tuner 108 provides a control signal 144 to signal block generator 142 and a multiplexer control signal 146 to a multiplexer 148.

In one embodiment the multiplexer 148 receives a transmission signal 150 and a generated signal 152. The transmission signal 150 may be any transmission signal received from another memory interface fine tuning device 100. Furthermore, in one embodiment the generated signal 152 may be a data signal, address signal, a clock signal, a synthetic pulse signal, or train of pulses, or any suitable signal as recognized by one having ordinary skill in the art. The multiplexer 148 thereupon selects a select signal 154 based on the multiplexer control signal 146.

The transmitter 110 receives the select signal 154 and thereupon transmits the transmitting tuning signal 140. In a preferred embodiment, the transmitting tuning signal 140 is provided to a memory device, an impedance load simulating the memory device, or a combination thereof.

Figure 3:
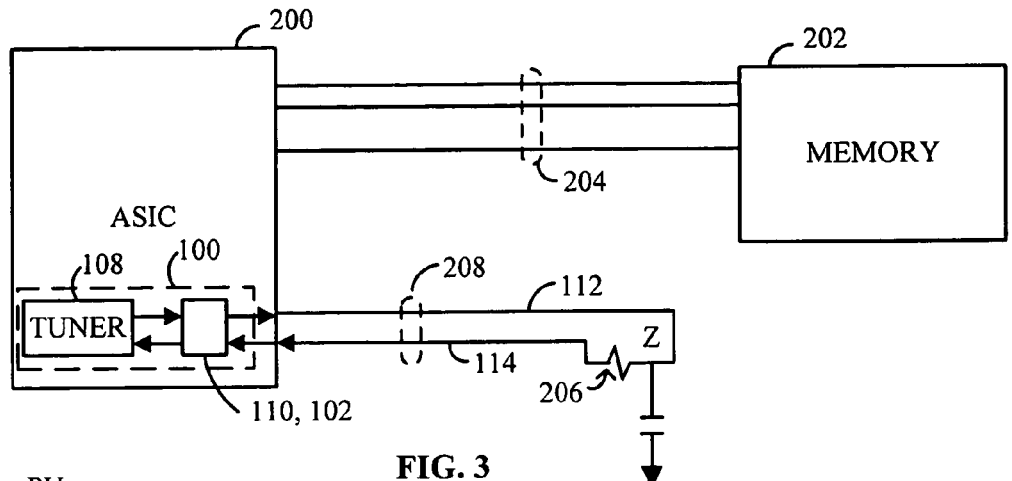
FIG. 3 illustrates an apparatus for fine tuning a memory interface in accordance with one embodiment of the present invention.

FIG. 3 illustrates one embodiment of an apparatus for memory fine tuning. An ASIC 200 includes the memory interface fine tuning device 100 as described above in FIGS. 1 and 2. A memory 202 is operatively coupled to the ASIC 200 across the plurality of electrical lead lines 204. As recognized by one having ordinary skill in the art, FIG. 3 illustrates a representative example of the plurality of electrical lead lines 204, but any suitable number of lines may be utilized for providing transferring information between the ASIC 200 and the memory 202.

FIG. 3 further illustrates an impedance load 206 having a resistive value Z connected to the ASIC 200 across electrical lead lines 208. In one embodiment, the impedance load 206 has an impedance value Z which emulates the impedance load of a signal transfer from the ASIC 200 to the memory 202 across the lead lines 204, more specifically emulating the voltage drop of a signal across the memory 202. The transmitter transmits the tuning signal 112 which is passed across the impedance load 206 and received as the input signal 114 by the receiver 102. Utilizing the tuner 108, a new tuning signal is generated and provided back across the load for an entered process to effectuate the tuning of the memory interface for the ASIC 200. As noted, the memory interface fine tuning device 100 disposed within the ASIC 200 includes many limitations which have been omitted for clarity purposes only.

In one embodiment, basic input output software may be programmed into a flash memory, or any other suitable memory, during manufacturing assembly. The BIOS may contain algorithms and default values used to initialize a graphics processing unit every time it is powered up or comes out of a reset mode. The present invention can be stored in the BIOS firmware code and default values and fine tuned determined values may be stored in the BIOS parameter tables. As a graphics processing system is powered on, the BIOS would recognize by reading the memory, fine tuning the right parameter table and determine the graphic subsystem is not operating at its optimal settings. The BIOS may then invoke the present invention software code as part of the BIOS to starting control memory fine tuning.

In one embodiment, the hardware required to develop an automatic memory fine tuning architecture includes input and output cells for the memory interface, a state machine, a control logic to coordinate the tuning process.

Figure 4:
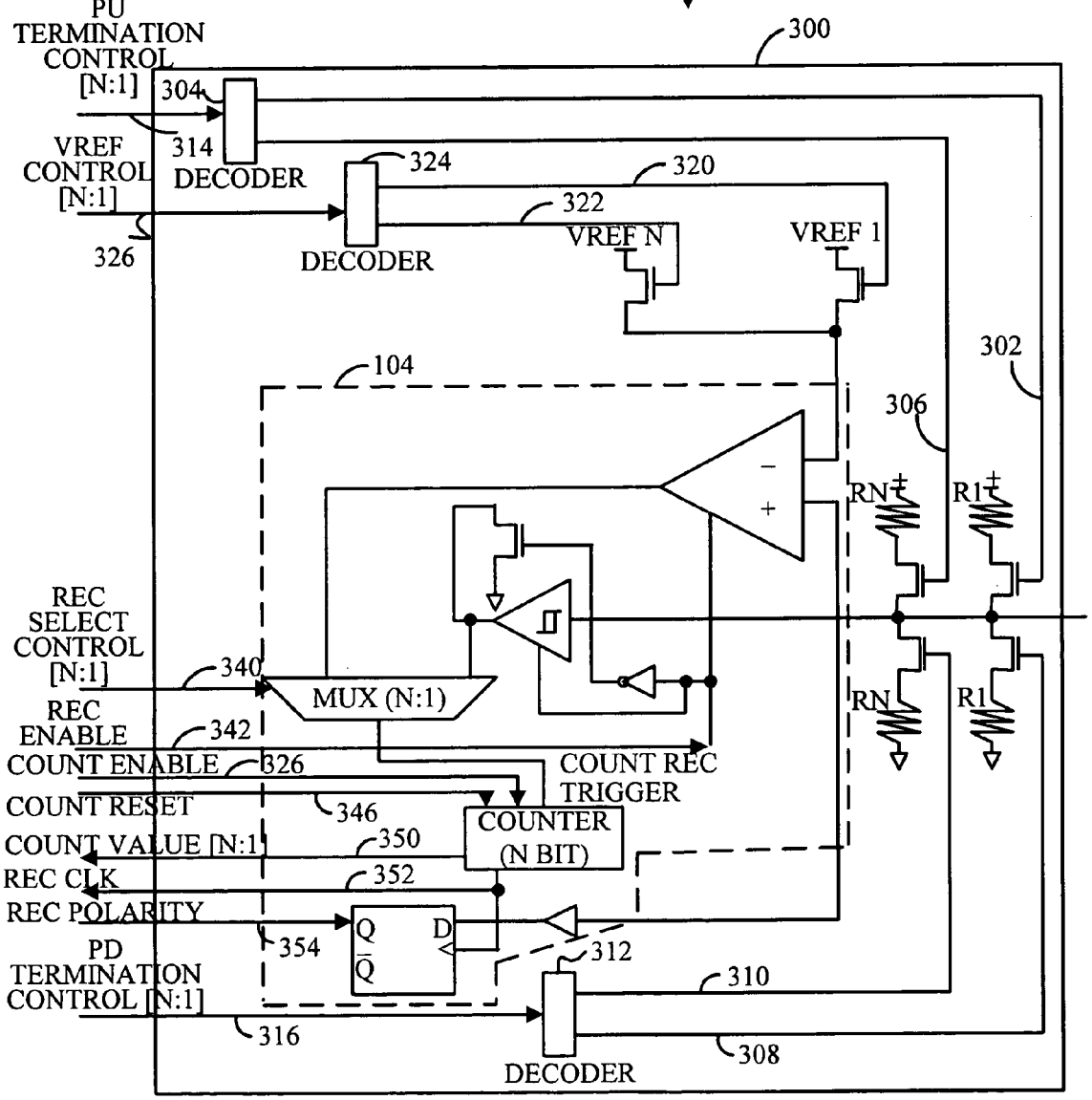
FIG. 4 illustrates one embodiment of a memory fine tuning input cell.

FIG. 4 illustrates one exemplary embodiment of an automatic memory fine tuning input cell. An input signal 301 is received across a voltage comparator, and optionally to a schmitt trigger receiver, for detecting the signal and measuring the signal strength. In one embodiment a optional decoders 304 and 308 along with one or more MOSFET or any type of silicon switch element, for providing a first control signal 302 to control input cell termination and/or attenuation dropping the input signal 300 across the second voltage. The decoder 304 and 312 are controlled by input termination control signals 314 and 316 which are provided by the state machine and control logic coordinating the tuning process.

A reference voltage control signal 326 is provided by the state machine and control logic that co-ordinates the tuning process, is provided to an optional decoder 324, which controls the reference voltages provided to the comparator. The comparator compares the input signal 301 against various reference voltages to determine the strength of the input signal 301.

The input signal 301 is provided to clock counter 104 including logic to generate, in one embodiment, a count value which can be used to determine the timing of the input signal 300. The input cell receives the following signals from the state machine and control logic coordinating the tuning process: selecting control signals 340 to select which type of input comparison will be used for evaluation, enable signal 342 to enable the signal receivers/detectors/comparators, count enable signal 344 to enable the counter, count reset signal 346. The counter generates a count value signal 350, which may be similar to the time value 128 of FIG. 1, a clock signal 352 and an optional polarity signal 354. The flipflop is optional, and it could also be implemented differently using other memory elements apparent to those of ordinary skill in the art. As recognized by one having ordinary skill in the art, the embodiment of FIG. 4 is for illustrative purposes and any other suitable combination of logic may be utilized to perform and generate the noted outputs which are provided, in one embodiment to state machine and control logic coordinating the tuning process, and FIG. 4 may receive various control signals from the to state machine and control logic coordinating the tuning process.

Figure 5:
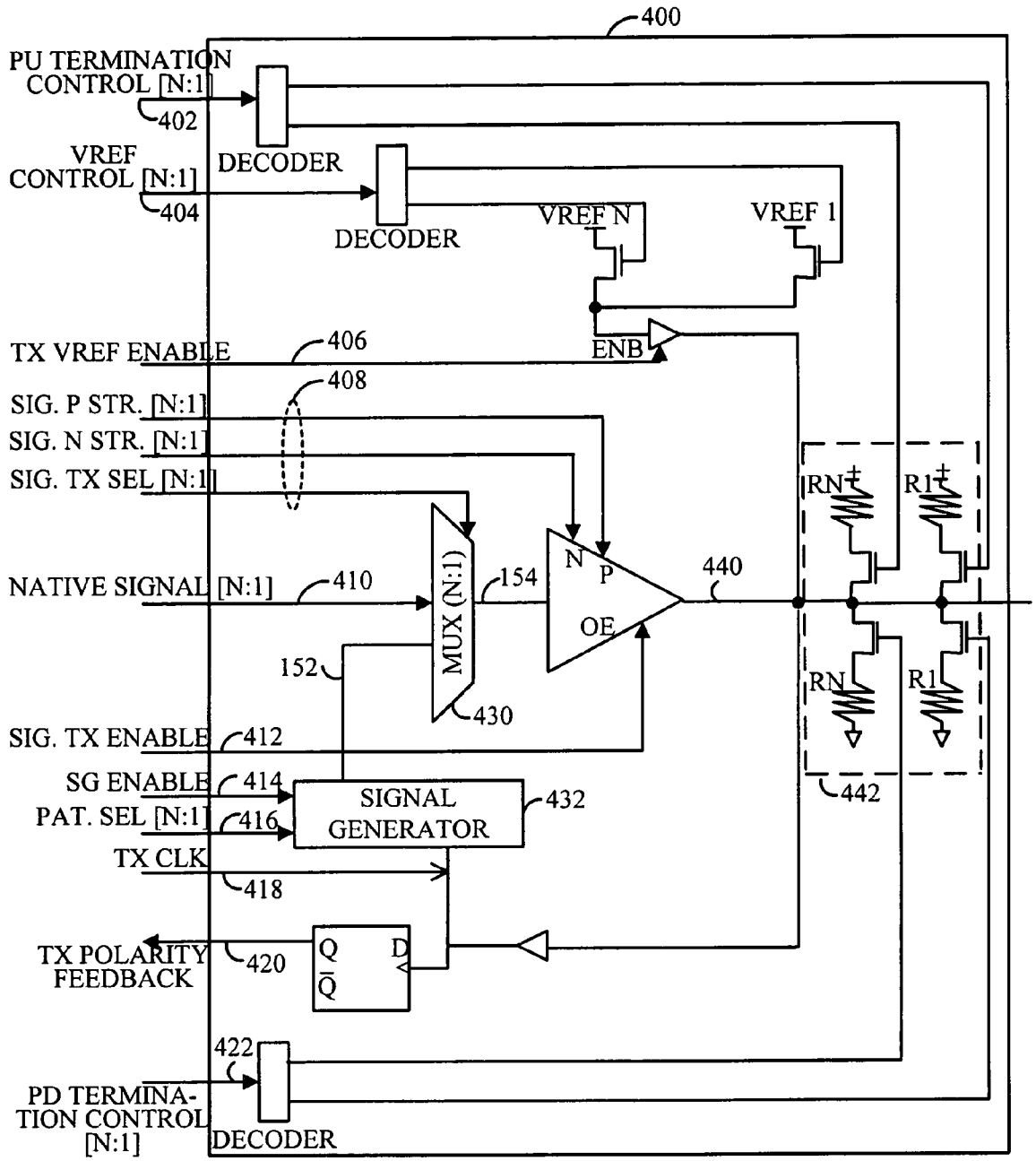
FIG. 5 illustrates one embodiment of a memory fine tuning output cell.

FIG. 5 illustrates one embodiment of an output cell 400 receiving a termination control signal 402, a voltage reference control signal 404, a voltage reference enable signal 406, signature signals 408, native signal 410, a signature enable signal 412, a signal enable 414, select signal 416, clock signal 418, polarity feedback 420 and a termination control signal 422. These input signals are received from the state machine and control logic coordinating the tuning processes. The cell 400 includes a multiplexer 430, similar to the multiplexer 148 of FIG. 2. Also, the cell 400 includes the signal generator 432 similar to the signal block generator 142 of FIG. 2. Based on a selection by the multiplexer between the generated signal 152 and a signal from another source, such as a signal generator disposed within another output cell or generated by the tuner (not shown), the multiplexer 430 generates the selected signal 154. The enable signal 412, a tuning signal 440 is generated and provided across the output signal driver creating the output signal 440. Optionally output termination/attenuation 442 in response to the termination control signals 402 and 422, can also be used to control the final output signal sent by the output cell 400. In addition and optionally, the output signal 440 can also be biased and offset by various reference control voltages provided to the output cell 400. As recognized by one of ordinary skill in the art, FIG. 5 exhibits exemplary embodiment of an output cell and that any other suitable implementation including hardware, software or any other combination may be utilized to provide the output signal 440.

Figure 6:
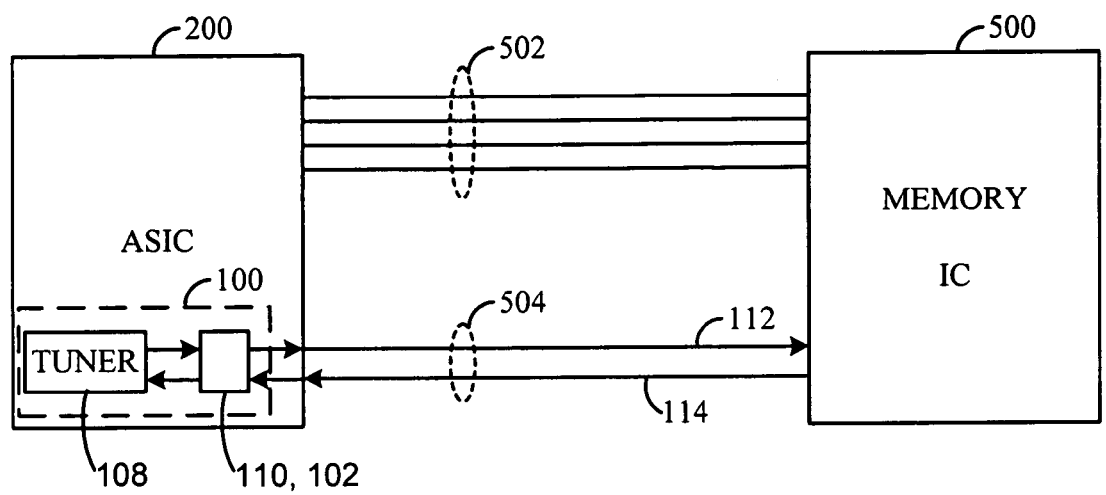
FIG. 6 illustrates an apparatus for fine tuning a memory interface in accordance with another embodiment with the present invention.

FIG. 6 illustrates an alternative embodiment of the present invention. The ASIC 200, a previously described in FIG. 3, includes the fine tune apparatus 100 with the tuner 108 and the transmitter 102 and receiver 110. The ASIC 200 is coupled to a memory 500 across a plurality of electrical leads 502 wherein any suitable number of electrical leads 502 may be provided for communication there across.

This embodiment of FIG. 6 further includes electrical leads directed to a predesignated portion of the memory 500, the electrical lead 504 provided for fine tuning the interface between the ASIC 200 and the memory 500. In this embodiment, the tuning signal 112 is provided to the memory 500 and the input signal 114 is provided back. The input signal is generated based on the voltage drop of the signal 112 as it effectuated by the memory 500. Therefore, this implementation allows for utilizing the existing memory 500 to automatically fine tune the memory interface between the ASIC 200 and the memory 500, instead of utilizing a special impedance load element.

Another embodiment may be the inclusion of the actual impedance load, such as load 206 of FIG. 3, within the memory 500. While this embodiment is not explicitly illustrated, special designated lead lines may be disposed in the memory 500 during its formation for the purposes of allowing interaction with the fine tuning apparatus 100 and the ASIC 200.

Figure 7:
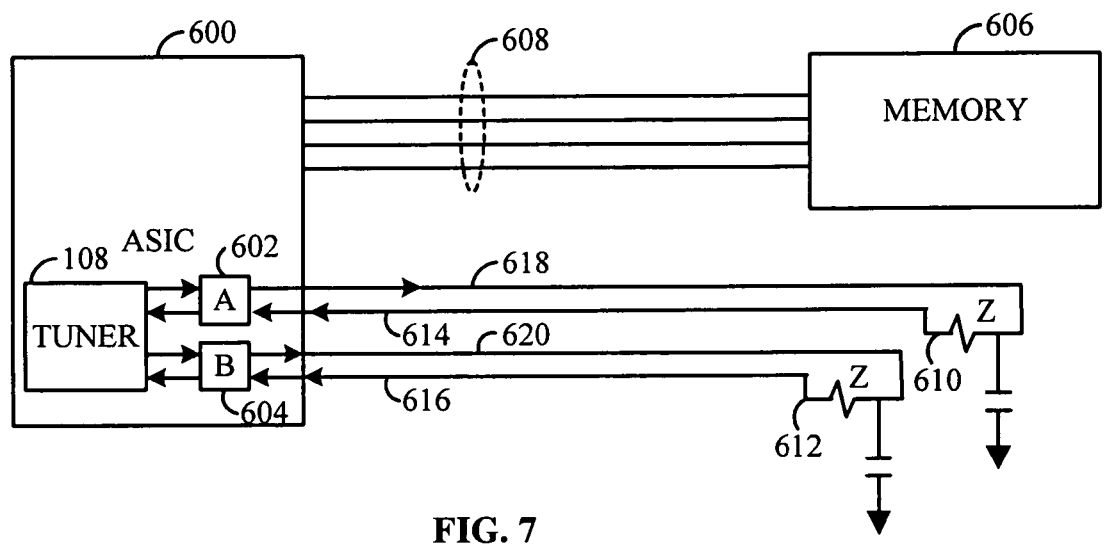
FIG. 7 illustrates an apparatus for fine tuning a memory interface in accordance with another embodiment to the present invention.

FIG. 7 illustrates another embodiment of the present invention with an ASIC 600 including a tuner 108, the first tuning element 602 on the second tuning element 604, wherein the tuning element include, in one embodiment, the input cells 301 of FIG. 4 and output cells 400 of FIG. 5. The ASIC is further coupled to a memory 606, wherein the memory 606 may be any standard memory device providing for communication of data with the ASIC 600 across a plurality of electrical leads 608. In this embodiment, a plurality of impedance loads 610 and 612 are utilized to determine a first input signal 614 and the second input signal 616 from a first tuning signal 618 to a second tuning signal 620.

In the embodiment of FIG. 7, cell 602 and 604 operate in accordance with standard techniques as described above, although utilizing multiple memory fine tuning apparatuses 602 and 604 allow for determining with a greater level of detail specific features, such as skew between two signals 614 and 616. In order to determine the timing skew between two or more signals, the tuner first evaluates the signal strength of the first signal and stores the timing value provided by the counter in a memory location "A". Then the tuner evaluates the second signal and stores the timing value "B" in a second memory location. The tuner then can determine the timing skew or difference between these two signals by substracting the values "A–B". The difference in the two count values represents the timing skew between the two signals.

Figure 8:
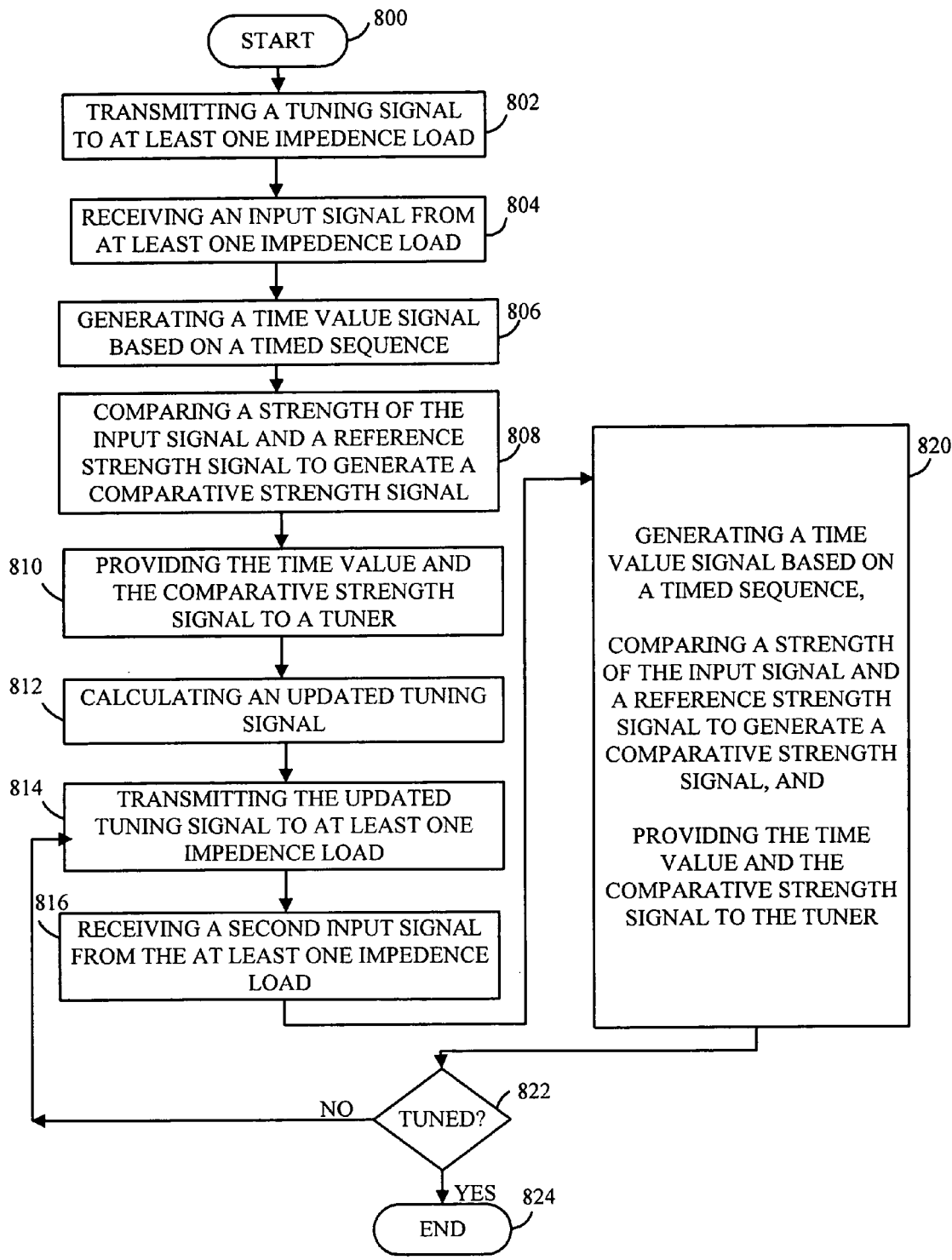
FIG. 8 illustrates a flow chart of a method for fine tuning a memory interface in accordance with one embodiment of the present invention.

FIG. 8 illustrates a method for fine tuning a memory interface. The method begins, 800, by transmitting a tuning signal to at least one impedance load, step 802. As discussed above, a tuning signal, such as tuning signal 112 may be provided from a transmitter 110. Step 804 is receiving an input signal from at least one impedance load. Similar to the illustrative embodiment of FIG. 3, the impedance load 206 provides for the generation of the input signal 114.

Step 806 is generating a time value signal based on a timed sequence. Step 808 is comparing a strength of the input signal and a reference strength signal to generate a comparative strength signal. Steps 806 and 808 operate, in one embodiment, as described above with regards to FIG. 1 and further with respect to FIG. 4. Step 810 is providing the time value and the compare strength signal to a tuner, such as in one embodiment to the tuner 108. Step 812 is calculating an updating tuning signal using, in one embodiment, internal logic for calculations of the level that the input signal is out of tuned and estimated parameters for attempting to place the memory interface in tune, such that the updated tuning signal is a next best guess at the proper memory interface parameters.

Step 814 is transmitting the updated tuning signal to at least one impedance load, similar to step 802, the tuning signal is provided to the same impedance load, such as 206 of FIG. 3. Step 816 is receiving a second input signal from the at least one impedance load. Similar to step 804, the second input signal emulates the voltage drop determined by a designated memory. Step 820 is generating a time value based on the time sequence, similar to step 806 and step 822 is comparing a strength of the input signal and a reference strength signal to generate a comparative strength signal, similar to step 808.

Step 824 is providing the time value and the comparative strength signal to the tuner, similar to step 810. Step 826 is the determination by the tuner if the memory interface has been tuned. If the memory interface is not tuned, the method proceeds to steps 814 and repeats steps 814 to 824 to then make a determination at step 826. The method then iterates through steps 814 to 826 until the interface is tuned. Once the interface is tuned, the method is complete, step 830.

It should be understood that the implementation of other variations and modifications of the invention in its various aspects will be apparent to those of ordinary skill in the art and that the invention is not limited by the specific embodiments described herein. For example, the impedance load 206 may be any suitable combination of hardware to provide for adjustment of the tuning signal to generate the input signal emulating the adjustment of the signal caused by interface with an associated memory device. It is therefore contemplated to cover the present invention, any and all modifications, variations, or equivalents that fall within the spirit and scope of the basic underlying principles disclosed and claimed herein.

What is claimed is:

1. An apparatus for fine tuning a memory interface, the apparatus comprising:
   a receiver operative to receive an input signal;
   a clock counter operative to calculate a time value based on a timed sequence determined by the reception of the input signal;
   a comparator operatively coupled to receive an input signal strength indicator signal from the receiver, the comparator operative to generate a comparative strength signal based on the comparison of the input signal strength indicator signal and a reference strength signal; and
   a first tuner operatively coupled to the clock counter such that the first tuner operatively receives the time value from the counter, the first tuner operatively coupled to the comparator to receive the comparative strength signal from the comparator such that the first tuner generates a tuning signal.

2. The apparatus of claim 1 further comprising:
   a transmitter operatively coupled to the first tuner, the transmitter operative to receive the tuning signal and operative to transmit the tuning signal.

3. The apparatus of claim 1 further comprising:
   the counter operative to receive a start signal from the first tuner to begin a timing interval; and
   the counter operative to receive a stop signal from the receiver upon reception of the input signal, the counter determining the timing based on the timing between the start signal and the stop signal, wherein the time value is the length of the timing interval.

4. The apparatus of claim 1 further comprising:
   a signal generator operatively coupled to a second tuner, operative to receive a control signal from the second tuner;
   at least one multiplexor operatively coupled to the signal generator, the at least one multiplexor operative to receive a generated signal from the signal generator; and
   the at least one multiplexor operatively coupled to the second tuner, the at least one multiplexor operative to receive a multiplex control signal.

5. The apparatus of claim 4 further comprising:
   the at least one multiplexor operative to select a selected signal based on the generated signal and at least one transmission signal; and
   the at least one multiplexor operatively coupled to a transmitter, the transmitter operative to receive the selected signal and the transmitter operative to transmit a transmitting tuning signal, wherein the transmitting tuning signal is based on the selected signal.

6. The apparatus of claim 5 wherein the selected signal is at least one of: a memory data signal, an memory address signal, a memory control signal, a clock signal, and a synthetic pulse signal.

7. The apparatus of claim 1 wherein the receiver, the clock counter, the comparator and the first tuner are disposed within an application specific integrated circuit.

8. An apparatus for fine tuning a memory interface, the apparatus comprising:
   at least one processing device including:
      a receiver operative to receive an input signal;
      a clock counter operative to calculate a time value based on a timed sequence determined by the reception of the input signal;
      a comparator operatively coupled to receive an input signal strength indicator signal from the receiver, the comparator operative to generate a comparative strength signal based on the comparison of the input signal strength indicator signal and a reference strength signal; and
      a first tuner operatively coupled to the clock counter such that the first tuner operatively receives the time value from the counter, the first tuner operatively coupled to the comparator to receive the comparative strength signal from the comparator such that the first tuner generates a tuning signal; and
   at least one memory device operably coupleable to the at least one processing device.

9. The apparatus of claim 8 further comprising: at least one electrical load operably coupled to the at least one processing device, the at least one electrical load operably coupled to receive the tuning signal and generate the input signal based on the transmission of the tuning signal across the at least one electrical load.

10. The apparatus of claim 9 wherein the at least one electrical load is disposed within the at least one memory device.

11. The apparatus of claim 8, the at least one processing device further including:
    the counter operative to receive a start signal from the first tuner to begin a timing interval; and
    the counter operative to receive a stop signal from the receiver upon reception of the input signal, the counter determines the timing based on the timing between the start signal and the stop signal, wherein the time value is the length of the timing interval.

12. The apparatus of claim 8, the at least one processing device further including:
    a signal generator operatively coupled to a second tuner, operative to receive a control signal from the second tuner;
    at least one multiplexor operatively coupled to the signal generator, the at least one multiplexor operative to receive a generated signal from the signal generator; and
    the at least one multiplexor operatively coupled to the second tuner, the at least one multiplexor operative to receive a multiplex control signal.

13. The apparatus of claim 12, the at least one processing device further including:
    the at least one multiplexor operative to select a selected signal based on the generated signal and at least one transmission signal; and
    the at least one multiplexor operatively coupled to a transmitter, the transmitter operative to receive the selected signal and the transmitter operative to transmit a transmitting tuning signal, wherein the transmitting tuning signal is based the selected signal.

14. The apparatus of claim 8 wherein the at least one processing device is disposed within an application specific integrated circuit.

15. A method for fine tuning a memory interface, the method comprising:
    (a) transmitting a tuning signal to at least one impedance load;

(b) receiving an input signal from the at least one impedance load;

(c) generating a time value signal based on a timed sequence between the tuning signal and the input signal;

(d) comparing a strength of the input signal and a reference strength signal to generate comparative strength signal;

(e) providing the time value and the comparative strength signal to a tuner;

(f) calculating an updated tuning signal; and (g) transmitting the updated tuning signal to the at least one impedance load.

16. The method of claim 15 further comprising:

(h) receiving a second input signal from the at least one impedance load; and (i) repeating steps (c) through (e);

(j) determining if the memory interface is tuned; and (k) if the memory interface is not tuned, calculating a second updated tuning signal and transmitting the updated tuning signal to the at least one impedance load.

17. The method of claim 16 further comprising:
repeating steps (a) through (k) until the memory interface is tuned.

18. The method of claim 15 wherein step (c) further comprises:

(c1) receiving a start timing signal from a tuner;

(c2) incrementing a counter;

(c3) receiving a stop timing signal from a receiver upon reception of the input signal; and (c4) setting the timed sequence as a final value from the counter.

19. The method of claim 15 wherein the tuning signal may be at least one of: a memory data signal, an memory address signal, a memory control signal, a clock signal, and a synthetic pulse signal.

20. An apparatus for fine tuning a memory interface, the apparatus comprising:

a first at least one processing device operative to generate and transmit a first tuning signal;

a second at least one processing device operative to generate and transmit a second tuning signal;

a first at least one impedance load operatively coupled to receive the first tuning signal and generate a first input signal by passing the first tuning signal across the first at least one impedance load, the first input signal received by the first at least one processing device to determine at least one of: timing difference and signal strength; and a second at least one impedance load operatively coupled to receive the second tuning signal and generate a second input signal by passing the second tuning signal across the second at least one impedance load, the second input signal received by the second at least one processing device to determine at least one of: skew rate and a phase difference between the second timing signal and the second input signal.

21. The apparatus of claim 20 further comprising:
the first at least one processing device including:
a first signal generator operative to generate a first generated signal;

a first transmitter operatively coupled to the first signal generator, the first transmitter operative to receive the first generated signal and operative to transmit the first tuning signal based on the first generated signal;

a first receiver operative to receive the first input signal;

a first clock counter operative to calculate a first time value based on a timed sequence determined by the reception of the first input signal;

a first comparator operatively coupled to receive a first input signal strength indicator signal from the first receiver, the first comparator operative to generate a first comparative strength signal based on the comparison of the first input signal strength indicator signal and a reference strength signal; and a first tuner operatively coupled to the first counter such that the tuner operatively receives the time value from the counter, the first tuner operatively coupled to the comparator to receive the first comparative strength signal from the first comparator such that the first tuner generates a first updated tuning signal.

22. The apparatus of claim 21 further comprising:
the second at least one processing device including:
a second signal generator operative to generate a second generated signal;

a second transmitter operatively coupled to the second signal generator, the second transmitter operative to receive the second generated signal and operative to transmit the second tuning signal based on the second generated signal;

a second receiver operative to receive the second input signal;

a second clock counter operative to calculate a second time value based on a timed sequence determined by the reception of the second input signal;

a second comparator operatively coupled to receive a second input signal strength indicator signal from the second receiver, the second comparator operative to generate a second comparative strength signal based on the comparison of the second input signal strength indicator signal and a reference strength signal; and a second tuner operatively coupled to the second counter such that the tuner operatively receives the time value from the counter, the second tuner operatively coupled to the comparator to receive the second comparative strength signal from the second comparator such that the second tuner generates a second updated tuning signal.

23. The apparatus of claim 20 further comprising:
at least one memory device operably coupleable to the at least one processing device; and the first at least one electrical load and the second at least one electrical load have load values equivalent to a load value of the at least one memory device.

24. The apparatus of claim 23 wherein the first at least one electrical load and the second at least electrical load is disposed within the at least one memory device.

* * * * *